United States Patent
Salmon et al.

(10) Patent No.: US 7,307,900 B2
(45) Date of Patent: Dec. 11, 2007

(54) METHOD AND APPARATUS FOR OPTIMIZING STROBE TO CLOCK RELATIONSHIP

(75) Inventors: Joe Salmon, Placerville, CA (US); Navneet Dour, Folsom, CA (US); George Vergis, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 11/001,554

(22) Filed: Nov. 30, 2004

(65) Prior Publication Data

US 2006/0114742 A1   Jun. 1, 2006

(51) Int. Cl.
*G11C 7/00* (2006.01)
*G11C 7/10* (2006.01)
*G11C 8/00* (2006.01)
*G11C 8/18* (2006.01)
*G06F 13/00* (2006.01)

(52) U.S. Cl. .................. 365/193; 365/189.05; 365/233; 365/233.5; 711/105

(58) Field of Classification Search ........... 365/189.05, 365/193, 233, 233.5
See application file for complete search history.

(56) References Cited

U.S. PATENT DOCUMENTS

| | | | | |
|---|---|---|---|---|
| 5,289,580 A | * | 2/1994 | Latif et al. ...................... | 710/63 |
| 6,208,583 B1 | * | 3/2001 | Fujiwara ...................... | 365/233 |
| 6,646,929 B1 | * | 11/2003 | Moss et al. .................. | 365/194 |
| 2003/0021164 A1 | * | 1/2003 | Yoo et al. .................... | 365/193 |
| 2004/0233773 A1 | * | 11/2004 | Shin ............................ | 365/233 |
| 2005/0254337 A1 | * | 11/2005 | Lee et al. .................... | 365/233 |

FOREIGN PATENT DOCUMENTS

KR     2001035850 A  *  5/2001

* cited by examiner

*Primary Examiner*—Lý Duy Pham
(74) *Attorney, Agent, or Firm*—Caven & Aghevli LLC

(57) ABSTRACT

To allow a memory controller to synchronize strobe to clock relationship for a DRAM, a register, such as, a flip flop, is incorporated within the DRAM to facilitate the sampling of SCLK with DQS. Likewise, while the DRAM is in a test mode of operation, the memory controller advances or retards the clock to DQS at the memory controller hub (MCH) to achieve the proper DRAM relationship. In one embodiment, the memory controller advances DQS if a binary zero value is read. In contrast, the memory controller retards DQS if a binary one value is read.

12 Claims, 2 Drawing Sheets

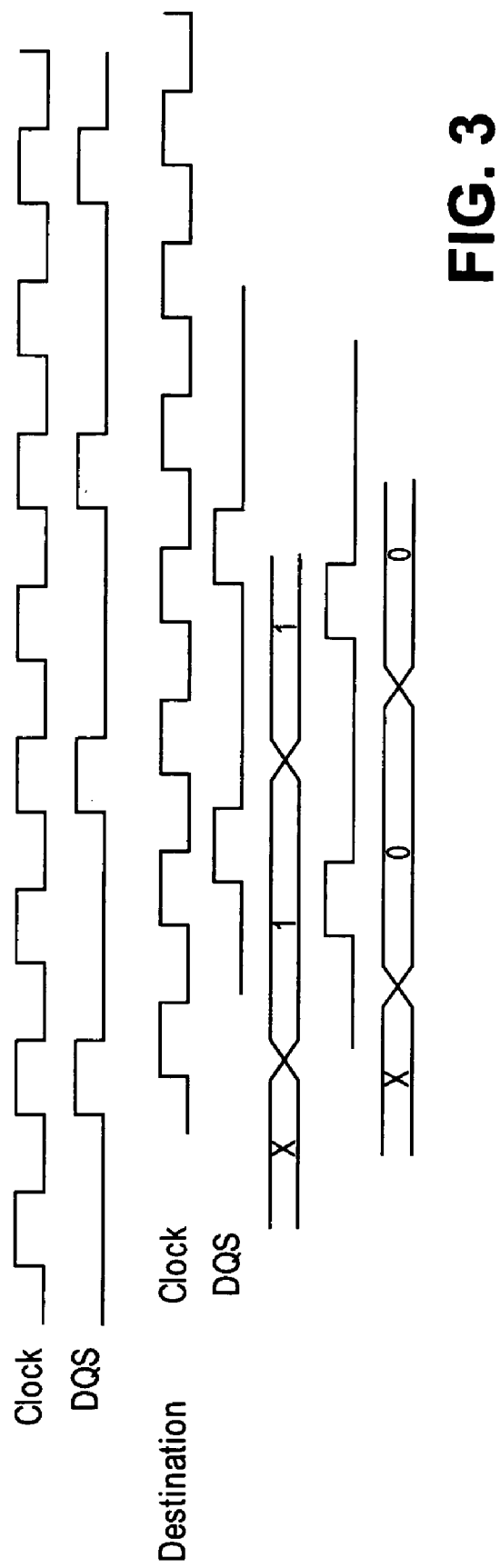

METHOD AND APPARATUS FOR OPTIMIZING STROBE TO CLOCK RELATIONSHIP

BACKGROUND OF THE INVENTION

1. Field of the Invention

The present invention relates allowing a memory controller to optimize strobe to clock relationship for a DRAM.

2. Background Information

A Dynamic Random Access Memory, DRAM, is a typical memory to store information for computers and computing systems, such as, personal digital assistants and cellular phones. DRAMs contain a memory cell array having a plurality of individual memory cells; each memory cell is coupled to one of a plurality of sense amplifiers, bit lines, and word lines. The memory cell array is arranged as a matrix of rows and columns, and the matrix is further subdivided into a number of banks.

One type of DRAM is a synchronous dynamic random access memory (SDRAM) that may allow for synchronous operation with a processor. Specific types of SDRAM are a single data rate (SDR) SDRAM and a double data rate (DDR) SDRAM. For example, a present DDR memory type is DDR3. Typically, a DDR DRAM may send data (DQ), when enabled by a DQS clock signal, to a memory controller or memory controller hub (MCH). The memory controller or MCH may receive the data from the DDR DRAM by utilizing precision delay cells to provide a delayed DQS clock signal.

Typically, motherboard specification and guidelines synchronize the DQS to a system clock (SCLK) relationship at a specific DRAM. However, with the advent of DDR3 DRAM, a typical tree structure for clocks is not utilized and the DQS to SCLK relationship differs by DRAM position on a Dual Inline Memory Module (DIMM).

BRIEF DESCRIPTION OF THE SEVERAL VIEWS OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference to the following detailed description when read with the accompanying drawings in which:

FIG. 3 is a timing diagram of one example for illustrating an embodiment of synchronizing DQS to SCLK relationship for a DRAM in accordance with the claimed subject matter.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention.

An area of current technological development relates to validation of integrated devices. As previously described, motherboard specification and guidelines synchronize the DQS to a system clock (SCLK) relationship at a specific DRAM. However, with the advent of DDR3 DRAM, a typical tree structure for clocks is not utilized and the DQS to SCLK relationship differs by DRAM position on a Dual Inline Memory Module (DIMM).

In contrast, a method and apparatus to synchronize the DQS to a system clock (SCLK) relationship by including a register, such as, a flip flop, in the DRAM to facilitate the sampling of SCLK with DQS. Likewise, while the DRAM is in a test mode of operation, the memory controller advances or retards the clock to DQS at the memory controller hub (MCH) to achieve the proper DRAM relationship. In one embodiment, the memory controller advances DQS if a binary zero value is read. In contrast, the memory controller retards DQS if a binary one value is read.

Figure 1:
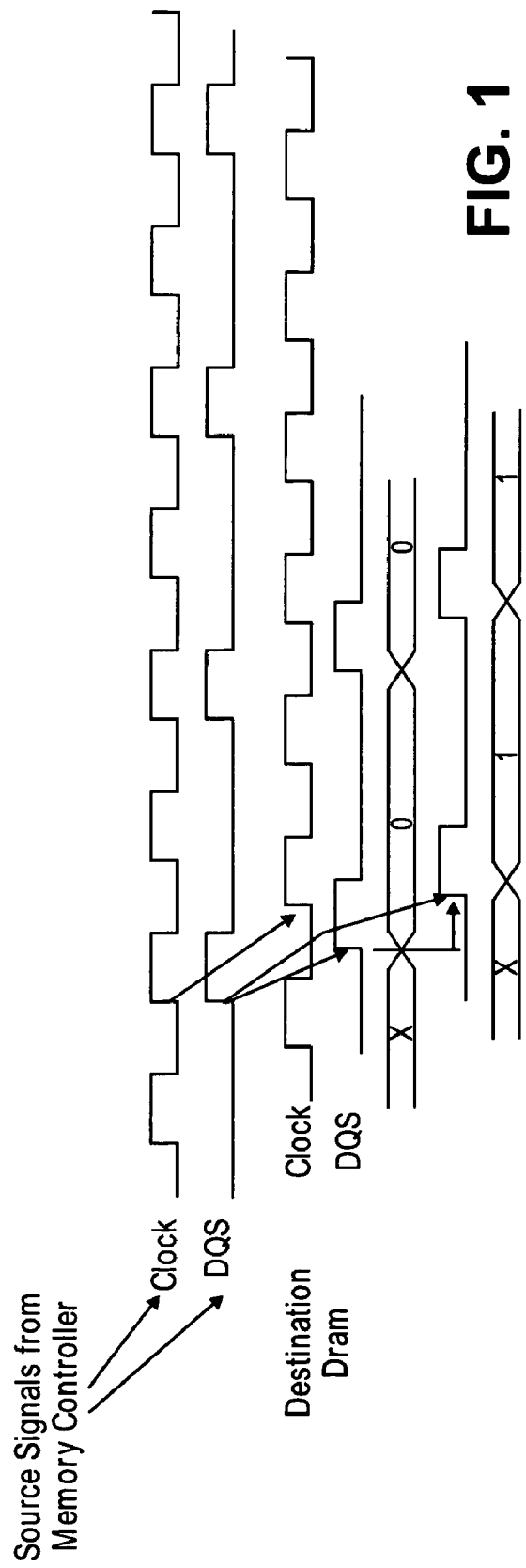
FIG. 1 is a timing diagram illustrating an embodiment of synchronizing DQS to SCLK relationship for a DRAM in accordance with the claimed subject matter.

FIG. 1 is a timing diagram illustrating an embodiment of synchronizing DQS to SCLK relationship for a DRAM in accordance with the claimed subject matter. The signals, Clock and DQS (102) are from the source, the memory controller, and the destination signals are the clock 104 and DQS 106. In one embodiment, the source signals are from the memory controller and the destination signals are received at a DRAM.

In this embodiment, the DQS signal 106 is pushed back to capture the data transition of zero to one (label 110) to result in a new DQS signal 108. This particular timing diagram depicts optimizing DQS to SCLK relationship for DRAM devices (ranging from a first DRAM to a N+1 DRAM device).

For example, to optimize DQS to SCLK relationship for a first DRAM device, one may use the following equations.

$$Tflight\_DQS = Tflight\_CK +/- (Tcycle * minDutyCycle - Terr),$$

with CK being unloaded for most of the route.

In one embodiment, this equation relates the motherboard routing constraints of the dqs trace to the clock pin. In this embodiment, the DQS flight needs to be within the specified parameters. Likewise, the CK is "unloaded" and it refers to the clock line is not loaded by additional devices. For example, a motherboard trace would be unloaded once the CLK pin hits the first device on the dimm, hence, compensating the device impedance by adjusting the line width.

Continuing on, the memory controller advances DQS if a binary zero value is read. In contrast, the memory controller retards DQS if a binary one value is read. Next, to limit DQS:CK adjustment to routing constraint. In this embodiment, the adjustment is performed by utilizing the above equation and working it backwards into allowable differences in inches of motherboard route between SCK and DQS in order for the circuit/algorithm to function. For example, if the clock frequency equals 400 Mh, then Tcycle=2.5 nS. Also, a duty cycle of 38% was used The example shows that 38% of 2.5 nS is 950 pS. This means the skew between SCK and DQS could be 950 pS. Subsequently, working this backwards into mb route length you would divide the 950 pS by the mb trace velocity in pico-Seconds per inch. You really have to do this at the maximum frequency to insure it is ok . . . and the next calculation at 800MT does this, hence, indicates the routes could differ by 2.375" and still work.

Subsequently, move in increments that allows quantification of DQ:CK. For example, in one embodiment, the memory controller moves clock in increments that are less than the TDQSS spec.

Therefore, spacing DQS edges allows Asynch read by the controller with no additional DRAM set/reset/clock requirements.

For example, to optimize DQS to SCLK relationship for a N+1 DRAM device, the following equations may be used:

$$Tflight\_DQS0 = Tflight\_DQS1 +/- DQs\_Tolerance$$

Use DQS_n−1 DQS:CK relationship

Detect either a zero to one or one to zero transition.

Based on detection, either advance or retard DQS (advance if zero is read, retard if one is read).

Proceed to next device and repeat sequence.

Figure 2:
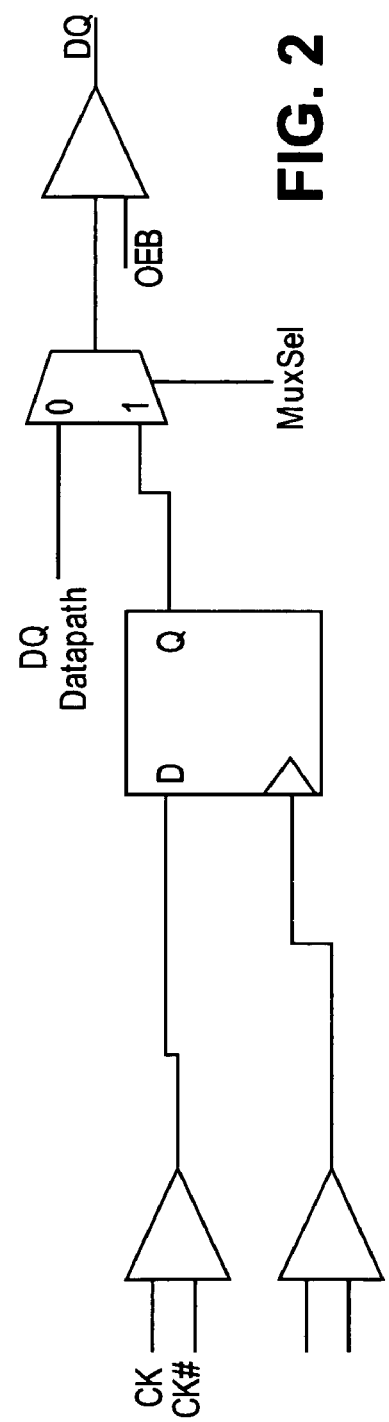
FIG. 2 is a schematic illustrating an embodiment to facilitate synchronizing DQS to SCLK relationship for a DRAM in accordance with the claimed subject matter.

FIG. 2 is a schematic illustrating an embodiment to facilitate synchronizing DQS to SCLK relationship for a DRAM in accordance with the claimed subject matter. This figure depicts one example of synchronizing DQS to SCLK relationship for a DRAM.

FIG. 3 is a timing diagram of one example for illustrating an embodiment of synchronizing DQS to SCLK relationship for a DRAM in accordance with the claimed subject matter. This figure depicts one example that was previously discussed. In another embodiment, one needs to determine whether the routing tolerance is too tight and when to include Tjit. In this embodiment, Tjit is included when the method of sampling SCK with DQS includes the jitter terms previously described. Furthermore, any jitter due to DRAM power supply must be included. . . .

Although the claimed subject matter has been described with reference to specific embodiments, this description is not meant to be construed in a limiting sense. Various modifications of the disclosed embodiment, as well as alternative embodiments of the claimed subject matter, will become apparent to persons skilled in the art upon reference to the description of the claimed subject matter. It is contemplated, therefore, that such modifications can be made without departing from the spirit or scope of the claimed subject matter as defined in the appended claims.

The invention claimed is:

1. A method for synchronizing a strobe signal to a clock signal relationship for a memory comprising:
   a memory controller to send the clock signal and the strobe signal to a memory device;
   the memory device to sample the clock signal with the strobe signal;
   the memory device to send back information asynchronously on one or more data pins; and
   the memory controller advancing the strobe signal if a binary zero value is read and the memory controller retarding the strobe signal if a binary one value is read.

2. The method of claim 1 wherein the memory device is a DDR3 DRAM.

3. The method of claim 1 wherein the data pins are DQ pins.

4. A method for synchronizing a strobe signal to a clock signal relationship for a memory comprising:
   sending the clock signal and the strobe signal to a memory device;
   sampling the clock signal with the strobe signal;
   sending back information asynchronously on one or more data pins; and
   advancing the strobe signal if a binary zero value is read or retarding the strobe signal if a binary one value is read.

5. The method of claim 4 wherein the memory device is a DDR3 DRAM.

6. The method of claim 4 wherein the data pins are DQ pins.

7. A method for synchronizing a strobe signal to a clock signal relationship for a memory while the memory device is in a test mode of operation comprising:
   sending the clock signal and the strobe signal to a memory device;
   sampling the clock signal with the strobe signal;
   sending back information asynchronously on one or more data pins; and
   advancing the strobe signal if a binary zero value is read or retarding the strobe signal if a binary one value is read.

8. The method of claim 7 wherein the memory device is a DDR3 DRAM.

9. The method of claim 7 wherein the data pins are DQ pins.

10. A system to synchronize a strobe signal to a clock signal relationship for a memory comprising:
    a memory controller to send the clock signal and the strobe signal to a memory device;
    the memory device to sample the clock signal with the strobe signal;
    the memory device to send back information asynchronously on one or more data pins; and
    the memory controller advancing the strobe signal if a binary zero value is read and the memory controller retarding the strobe signal if a binary one value is read.

11. The method of claim 10 wherein the memory device is a DDR3 DRAM.

12. The method of claim 10 wherein the data pins are DQ pins.

* * * * *